United States Patent
Matsumoto et al.

[11] Patent Number: 6,114,184
[45] Date of Patent: Sep. 5, 2000

[54] METHOD FOR MANUFACTURING LCD DEVICE CAPABLE OF AVOIDING SHORT CIRCUIT BETWEEN SIGNAL LINE AND PIXEL ELECTRODE

[75] Inventors: Seiichi Matsumoto; Osamu Sukegawa; Wakahiko Kaneko; Hirofumi Ihara, all of Tokyo, Japan

[73] Assignee: NEC Corporation, Tokyo, Japan

[21] Appl. No.: 08/962,299

[22] Filed: Oct. 31, 1997

Related U.S. Application Data

[62] Division of application No. 08/364,221, Dec. 27, 1994, Pat. No. 5,872,021.

[30] Foreign Application Priority Data

Dec. 30, 1993 [JP] Japan ..................... 5-352442

[51] Int. Cl.[7] .................. H01L 21/84; H01L 21/336; G02F 1/136
[52] U.S. Cl. ................ 438/30; 438/158; 438/159; 257/59
[58] Field of Search ............. 257/59, 88; 438/30, 438/158, 159, FOR 155, FOR 183, FOR 200, FOR 261, FOR 211, FOR 208; 359/54, 55, 59

[56] References Cited

U.S. PATENT DOCUMENTS

| 5,032,531 | 7/1991 | Tsutsui et al. . | |
|---|---|---|---|
| 5,075,244 | 12/1991 | Sakai et al. . | |
| 5,166,086 | 11/1992 | Takeda et al. . | |
| 5,483,082 | 1/1996 | Takizawa et al. | 257/59 |
| 5,539,551 | 7/1996 | Nomoto et al. | 359/59 |
| 5,818,551 | 10/1998 | Park | 349/43 |
| 5,824,564 | 10/1998 | Watanabe | 438/30 |

FOREIGN PATENT DOCUMENTS

| 64-24326 | 2/1989 | Japan . |
| 2-234126 | 9/1990 | Japan . |
| 4-324938 | 11/1992 | Japan . |

*Primary Examiner*—M. Wilczewski
*Attorney, Agent, or Firm*—Foley & Lardner

[57] ABSTRACT

In a method for manufacturing an LCD device where a gate insulating layer is formed on an insulating substrate and a signal line pattern layer and a pixel electrode pattern layer are formed on a signal line forming area and a pixel electrode forming area, respectively, of the gate insulating layer, a part of the gate insulating layer between the signal line forming area and the pixel electrode forming area is etched.

3 Claims, 21 Drawing Sheets

METHOD FOR MANUFACTURING LCD DEVICE CAPABLE OF AVOIDING SHORT CIRCUIT BETWEEN SIGNAL LINE AND PIXEL ELECTRODE

This application is a divisional of application Ser. No. 08/364,221, filed Dec. 27, 1994, U.S. Pat. No. 5,872,021.

BACKGROUND OF THE INVENTION

1. Field of the Invention

The present invention relates to a method for manufacturing a liquid crystal display (LCD) device, and particularly, to a method for manufacturing an LCD device capable of avoiding a short circuit between a signal line and a pixel electrode.

2. Description of the Related Art

Active matrix LCD devices using thin film transistors (TFT's) have been developed in terms of resolution and performance, since the TFT's can be made of amorphous silicon.

In a prior art method for manufacturing an active matrix LCD device, a gate line pattern layer is formed on a TFT forming area of an insulating substrate. Then, a gate insulating layer is formed on the gate line pattern layer and the insulating substrate. Next, an amorphous silicon pattern layer is formed on the TFT forming area of the gate insulating layer, and a signal line pattern layer is formed on a signal line forming area of the gate insulating layer. Also, a pixel electrode pattern layer is formed on a pixel electrode pattern forming area of the gate insulating layer. This will be explained later in detail.

In the above-mentioned prior art method, however, since the signal line pattern layer and the pixel electrode pattern layer are formed on the gate insulating layer, i.e., on the same plane, a short circuit may occur between the signal line pattern layer and the pixel electrode pattern layer. Particularly, when an etching process performed upon the amorphous silicon fails to etch a part of the amorphous silicon between a signal line forming area and a pixel electrode forming area, the amorphous silicon left therebetween may invite a short circuit between the signal line pattern layer and the pixel electrode pattern layer.

SUMMARY OF THE INVENTION

It is an object of the present invention to provide a method for manufacturing an LCD device capable of avoiding a short circuit between a signal line and a pixel electrode.

According to the present invention, in a method for manufacturing an LCD device where a gate insulating layer is formed on an insulating substrate and a signal line pattern layer and a pixel electrode pattern layer are formed on a signal line forming area, respectively, of the gate insulating layer, a part of the gate insulating layer between the signal line forming area and the pixel electrode forming area is etched.

Thus, even if amorphous silicon is left on the gate insulating layer between the signal line forming area and the pixel electrode forming area, such amorphous silicon is completely removed, thus avoiding a short circuit between the signal line pattern layer and the pixel electrode pattern layer.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art methods for manufacturing an active matrix LCD device will be explained with reference to FIGS. 1, 2A through 2E, 3, 4, and FIGS. 5A through 5D.

Figure 1:
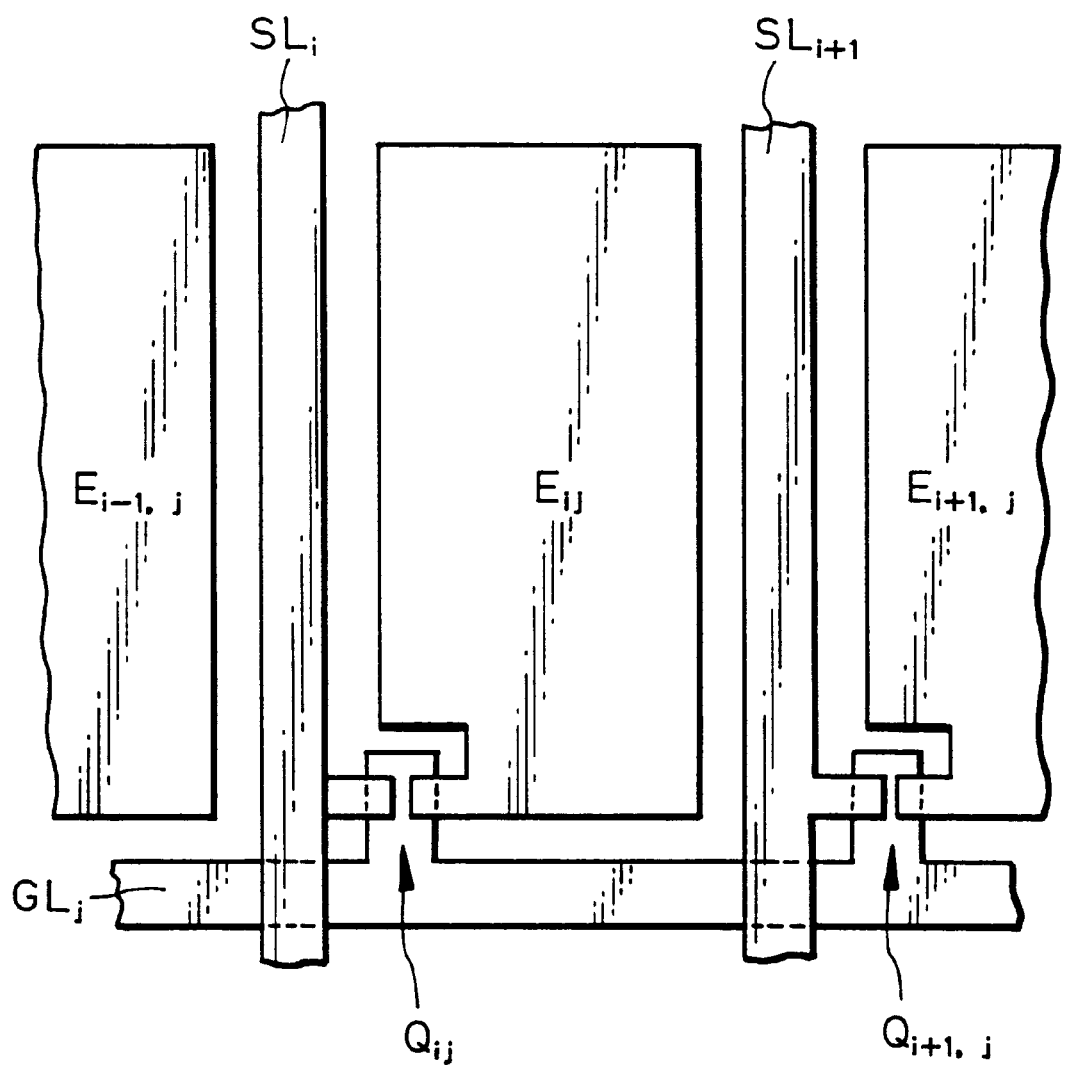
FIG. 1 is a plan view illustrating a prior art active matrix LCD device.

FIG. 1 is a plan view for illustrating a prior art active matrix LCD device; FIGS. 2A through 2E are cross-sectional views showing a first prior art method for manufacturing the device of FIG. 1; and FIG. 2 is a cross-sectional view of a signal line of FIG. 1.

First, referring to FIG. 1, a plurality of signal lines such as $SL_i$ and $SL_{i+1}$ and a plurality of gate lines such as $GL_j$ are provided, and one transparent pixel electrode such as $E_{i-1,j}$, $E_{ij}$ or $E_{i-1,j}$, is provided via a TFT such as $Q_{ij}$ or $Q_{i+1,j}$, at each intersection between the signal lines $SL_i$, $SL_{i+1}$, ... and the gate lines $GL_j$, .... For example, in the TFT $Q_{ij}$, a gate is connected to the gate line $GL_j$, a source is connected to the pixel electrode $E_{ij}$, and a drain is connected to the signal line $SL_i$. That is, when the TFT $Q_{ij}$ is turned ON and OFF by the voltage at the gate line $GL_j$, the signal line $SL_i$ is connected to the pixel electrode $E_{ij}$ and is disconnected therefrom.

The manufacture of the LCD device of FIG. 1 is explained next with reference to FIGS. 2A through 2E which are cross-sectional views of the periphery of the TFT $Q_{ij}$ of FIG. 1. In FIGS. 2A through 2E, A1 designates a TFT forming area, A2 designates a signal line forming area, and A3 designates a pixel electrode forming area.

Figure 2A:
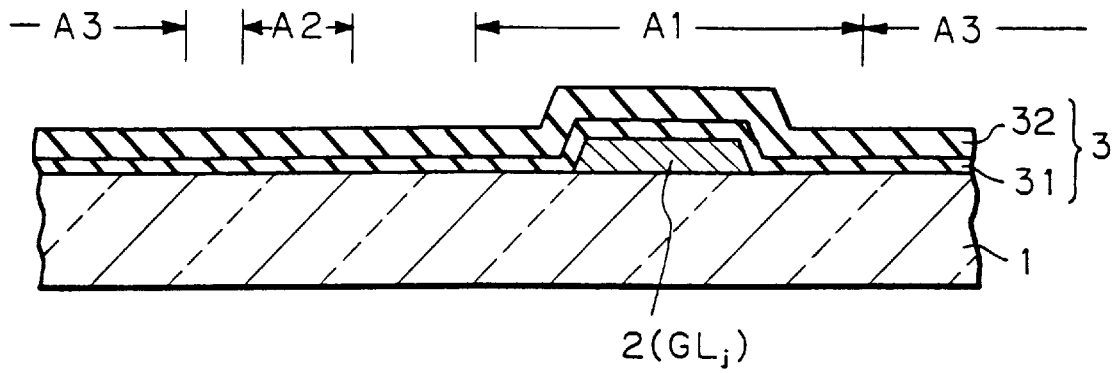
FIG. 2A through 2E are cross-sectional views showing a first prior art method for manufacturing the active matrix LCD device of FIG. 1.

Referring to FIG. 2A, a gate line layer 2 is formed on the TFT forming area A1 of a glass substrate 1. Also, a first gate insulating layer 31 made of TaO, SiO or the like is deposited on the entire surface, and then, a second gate insulating layer 32 made of SiN or the like is deposited thereon, to form a gate insulating layer 3.

Figure 2B:
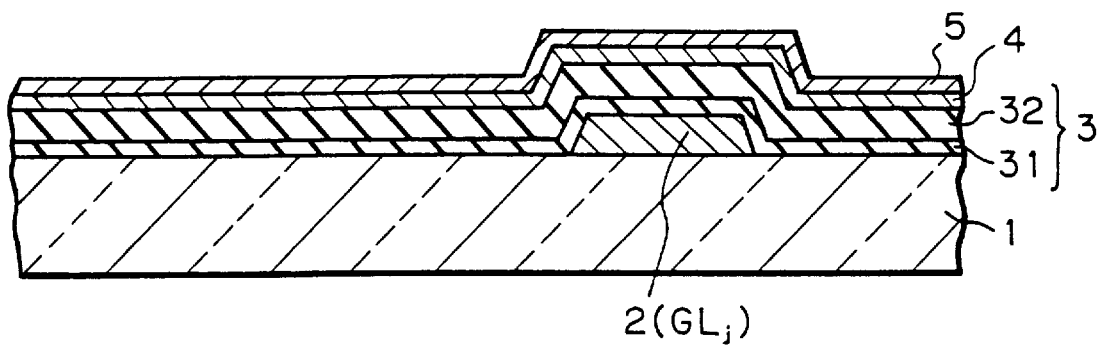

Next, referring to FIG. 2B, an I-type amorphous silicon layer 4 for channel regions of TFT's is deposited on the entire surface, and an N-type amorphous silicon layer 5 for low-resistance contact structures is deposited thereon.

Figure 2C:
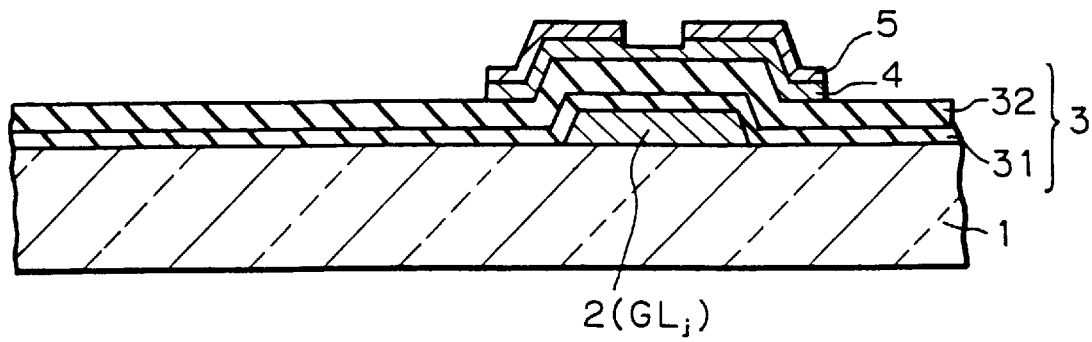

Next, referring to FIG. 2C, the amorphous silicon layers 4 and 5 are patterned.

Next, the gate insulating layer 3 is patterned so that contact holes (not shown) are formed therein for contact structures.

Figure 2D:
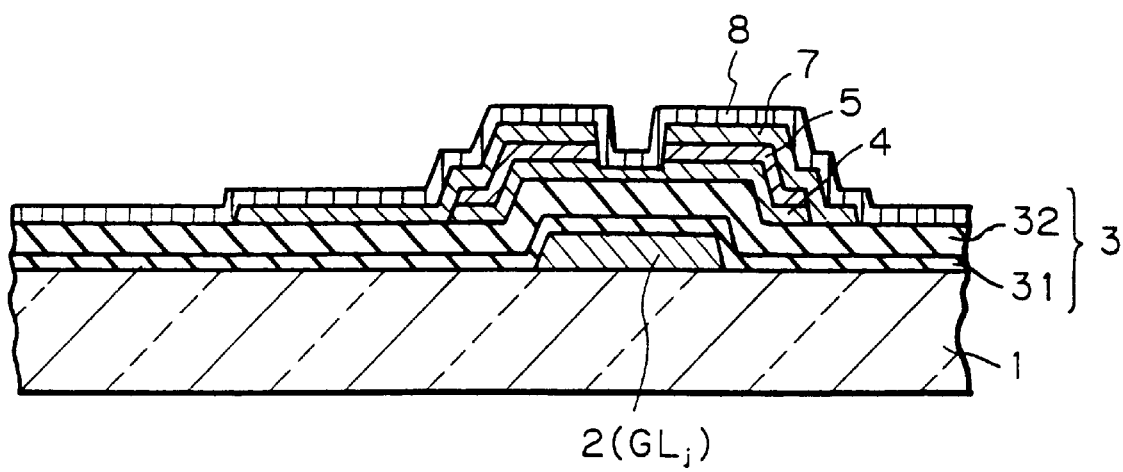

Next, referring to FIG. 2D, a conductive pattern layer 7 of a single layer or a multiple layer made of Cr, Mo/Ta, Al or Al/Ta is formed. Also, a transparent pixel electrode layer 8 made of ITO is formed on the entire surface.

Figure 2E:
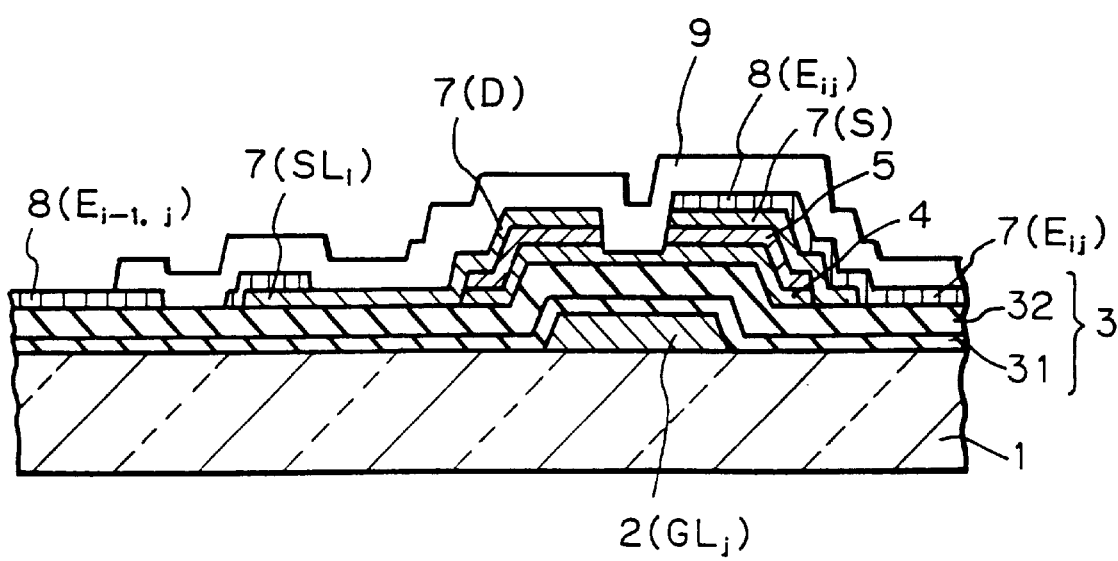

Finally, referring to FIG. 2E, the transparent pixel electrode layer 8 is patterned. Then, a passivation layer 9 is formed and is patterned. In this case, the periphery of the signal line $SL_i$ is shown in FIG. 3.

Figure 3:
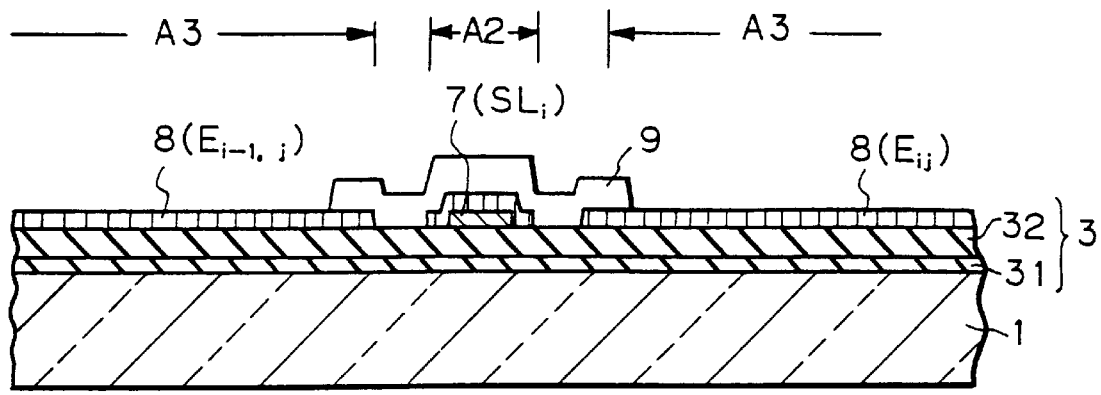
FIG. 3 is a cross-sectional view of the signal line of FIG. 1.

In FIGS. 2E and 3, the conductive pattern layers 7(S) and 7(D) are a source and a drain, respectively, of the TFT $Q_{ij}$. Also, the conductive pattern layer 7 ($SL_i$) is the signal line $SL_i$. Further, the pixel electrode pattern layers 8 ($E_{i-1,j}$) and 8 ($E_{ij}$) are the pixel electrodes $E_{i-1,j}$ and $E_{ij}$, respectively.

Figure 4:
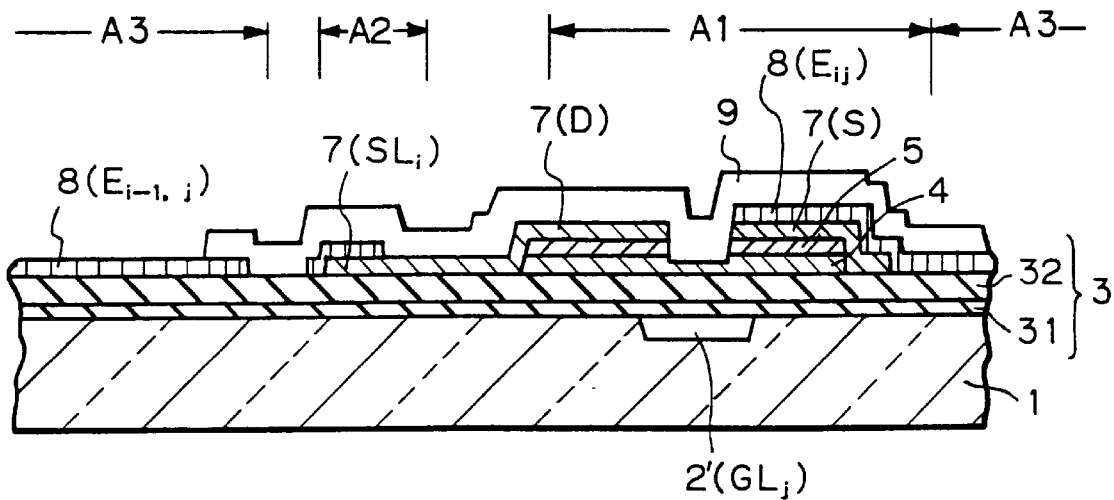
FIG. 4 is a cross-sectional view showing a modification of FIG. 2E.

In FIG. 4, which is a modification of FIG. 2E, a gate line layer 2' is buried within the glass substrate 1 (see JP-A-HEI4-324938). That is, the glass substrate 1 is etched by using Ar gas in an ion beam milling apparatus with a mask of a photoresist pattern (not shown). In this case, the etched depth is approximately the same as the height of the gate line layer 2 of FIG. 2E. As a result, the height of the TFT $Q_{ij}$ is decreased to reduce the defects of orientation and the defects of the liquid crystal. Also, the etched depth is made sufficiently large to reduce the resistance of the gate line layer 2.

A second prior art method for manufacturing an active matrix LCD device is explained next with reference to FIGS. 5A through 5D (see JP-A-HEI2-234126).

Figure 5A:
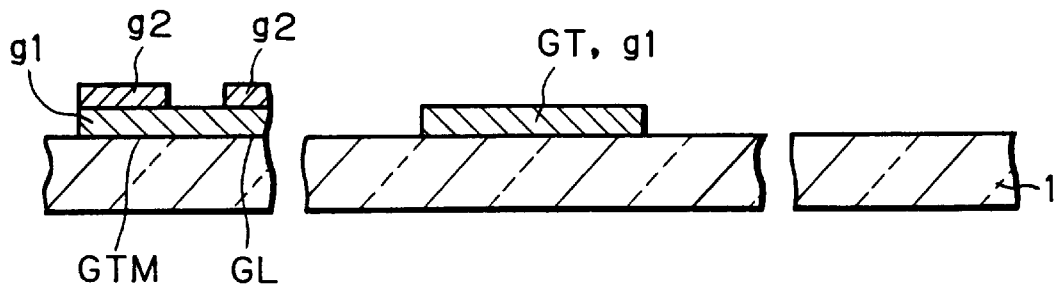
FIGS. 5A through 5D are cross-sectional views showing a second prior art method for manufacturing an active matrix LCD device.

First, referring to FIG. 5A, a conductive layer g1 made of Cr is formed by a sputtering process on a glass substrate 1, and then is patterned, to form a gate terminal GTM, a gate line GL and a gate electrode GT. Next, a conductive layer g2 made of Al is formed by a sputtering process on the gate terminal GTM and the gate line GL. In this case, the conductive layer g2 on the gate terminal GTM is outside of a passivation layer PSV (not shown in FIG. 5A, but shown in FIGS. 5C and 5D).

Figure 5B:
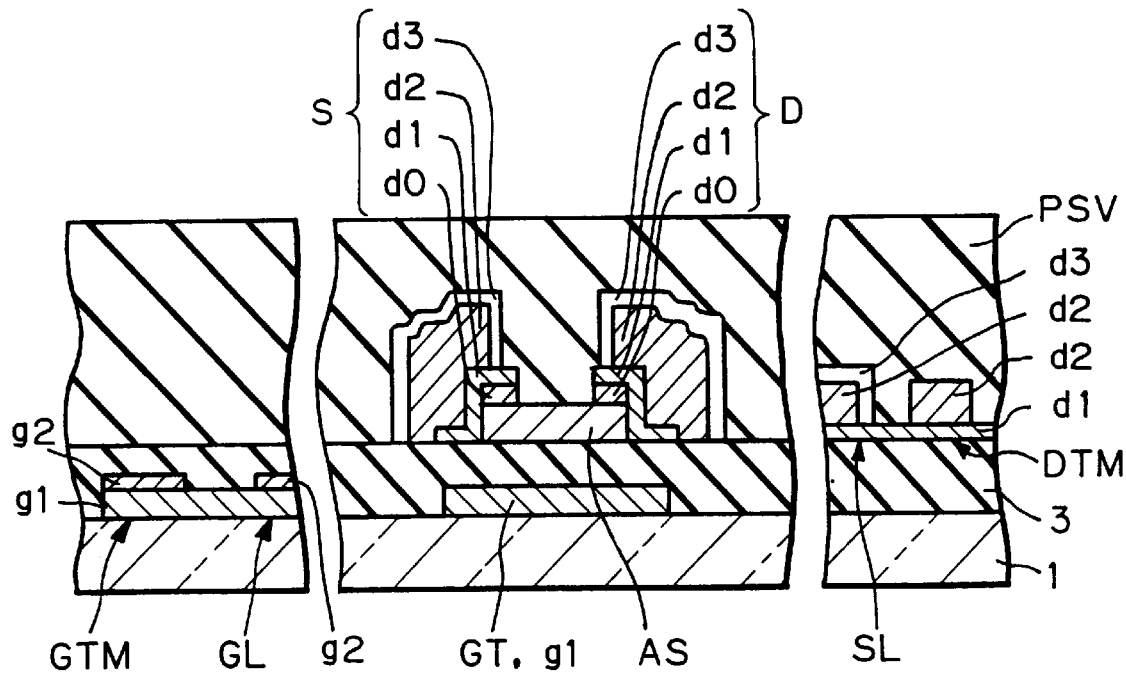

Next, referring to FIG. 5B, a gate insulating layer 3 made of silicon nitride is formed on the entire surface. Then, an I-type amorphous silicon layer AS and an $N^+$-type silicon layer d0 are formed. Next, a conductive layer d1 is formed and is patterned. Then, the conductive layer d0 is patterned. Also, a conductive layer d2 is formed and is patterned. Further, a transparent electrode layer d3 made of ITO is formed and is patterned. Thus, a source S, a drain D, and a signal line SL and a drain terminal DTM are formed. In this case, the conductive layer d2 on the drain terminal DTM is outside of the passivation layer PSV (see FIGS. 5C and 5D).

Then, the passivation layer PSV is formed by a plasma CVD process on the entire surface.

Figure 5C:
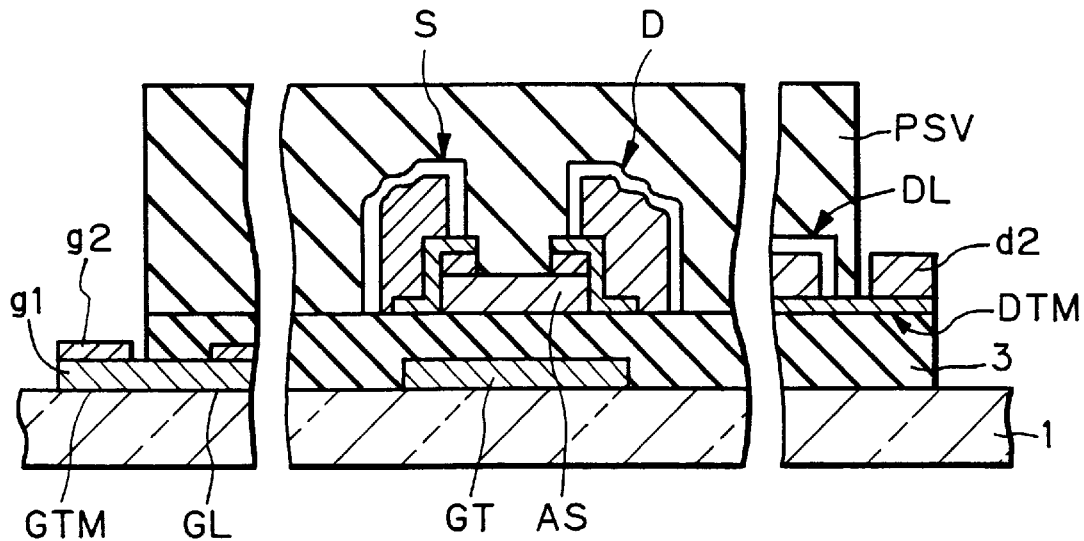

Next, referring to FIG. 5C, the passivation layer PSV is patterned and also, the gate insulating layer 3 is patterned.

Figure 5D:
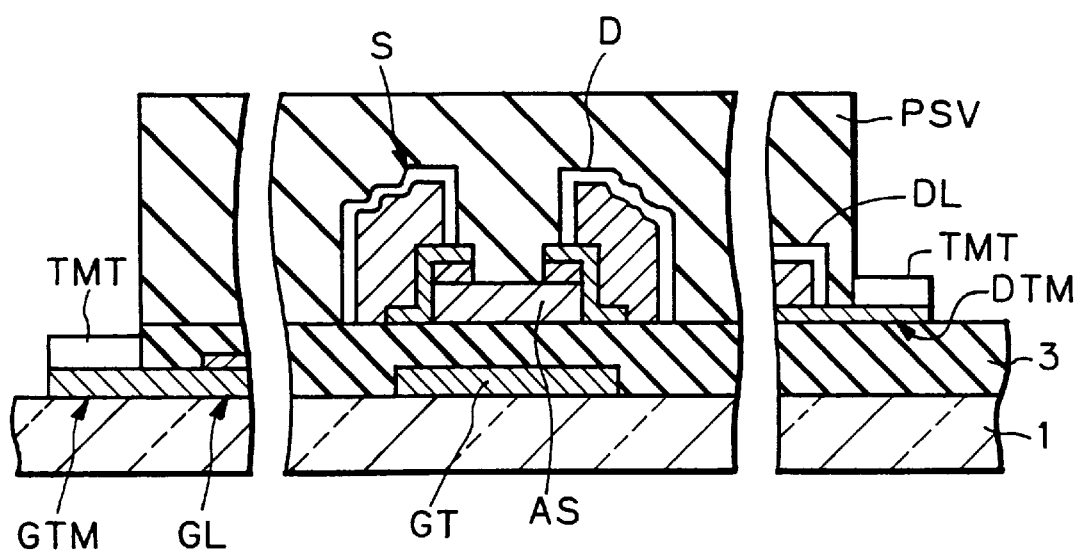

Finally, referring to FIG. 5D, the conductive layer g2 on the gate terminal GTM and the conductive layer d2 on the drain terminal DTM are removed. Then, a transparent pixel electrode layer made of ITO is formed and is patterned, to form an upper layer TMT on the gate terminal GTM and the drain terminal DTM.

Thus, in the second prior art as shown in FIGS. 5A through 5D, since the patterning of the gate insulating layer 3 is carried out simultaneously with the patterning of the passivation layer PSV, pinholes in the photoresist are hardly transferred to the gate insulating layer 3, so that short circuits rarely occur between the gate line GL (the gate electrode GT) and the drain line DL (the source and the drain), thus enhancing the manufacturing yield.

In the above-mentioned prior art methods, however, since the signal line (or the drain line) and the pixel electrode pattern layer are formed on the gate insulating layer 3, i.e., on the same plane, a short circuit may occur between the signal line (or the drain line) and the pixel electrode pattern layer. Particularly, when an etching process performed upon the amorphous silicon fails to etch a part of the amorphous silicon between a signal line forming area and a pixel electrode forming area, the amorphous silicon left therebetween may invite a short circuit between the signal line (or the drain line) and the pixel electrode pattern layer.

A first embodiment of the present invention will be explained next with reference to FIGS. 6, 7A through 7f and 8.

Figure 6:
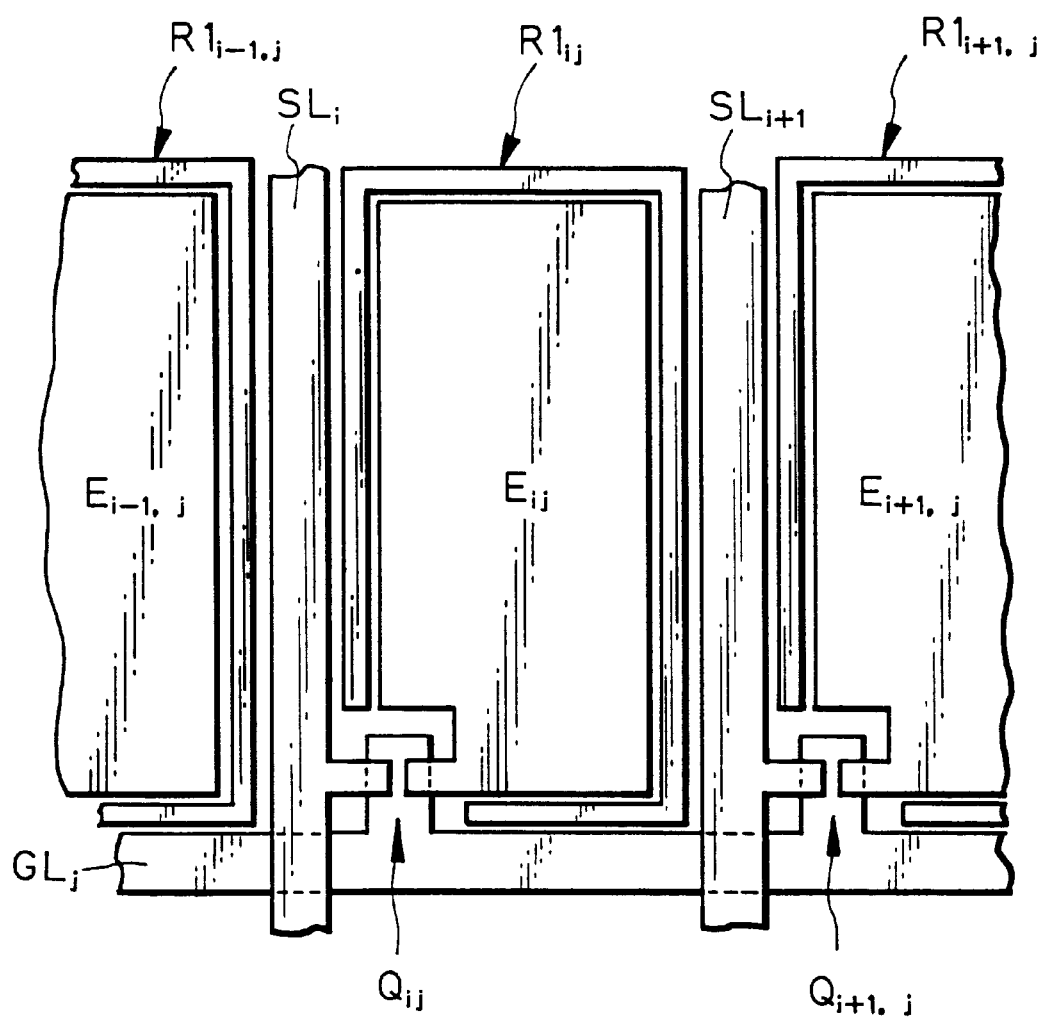
FIG. 6 is a plan view illustrating an active matrix LCD device according to the present invention.

FIG. 6 is a plan view that illustrates an active matrix LCD device according to the present invention; FIGS. 7A through 7F are cross-sectional views showing a method for manufacturing the device of FIG. 6; and FIG. 8 is a cross-sectional view of the signal line $SL_i$ of FIG. 6.

As shown in FIG. 6, a recess portion such as $R1_{i-1,j}$ is formed in the gate insulating layer 3 (not shown in FIG. 6, but shown in FIGS. 7D, 7E and 7F) between the signal line forming area and the pixel electrode forming area.

Figure 7A:
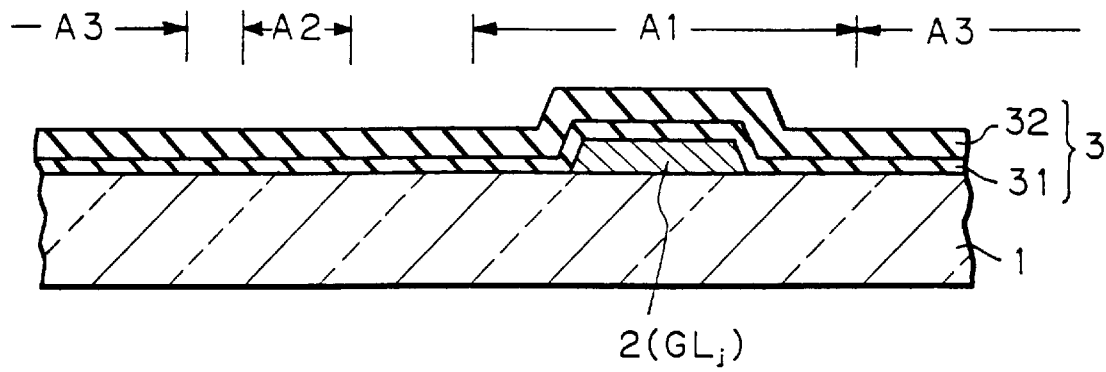
FIGS. 7A through 7F are cross-sectional views showing a first embodiment of the method for manufacturing the active matrix LCD device of FIG. 6.
Figure 8:
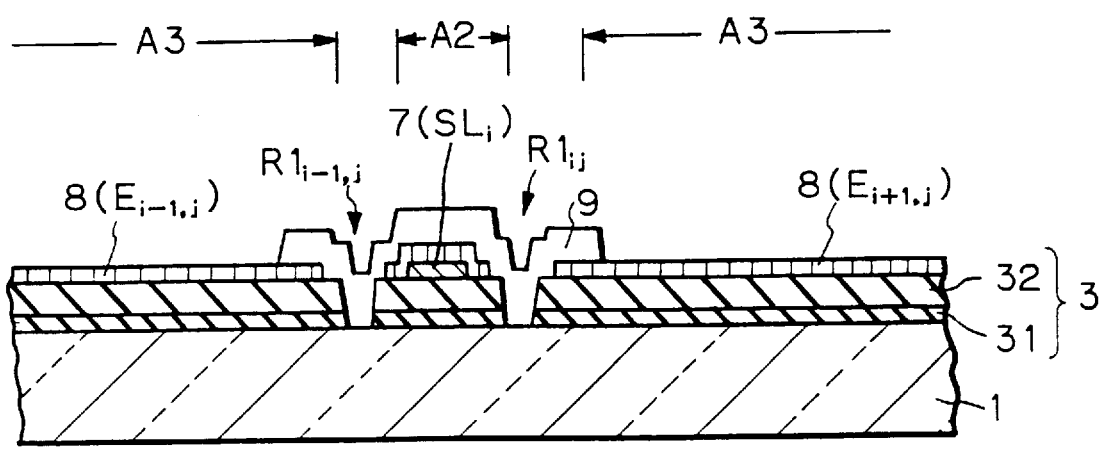
FIG. 8 is a cross-sectional view of the signal line of FIG. 6.

Referring to FIG. 7A, in the same way as in FIG. 2A, a gate line layer 2 is formed on the TFT forming area A1 of a glass substrate 1. Also, a first gate insulating layer 31 made of TaO, SiO or the like is deposited on the entire surface, and then, a second gate insulating layer 32 made of SiN or the like is deposited thereon, to form a gate insulating layer 3.

Figure 7B:
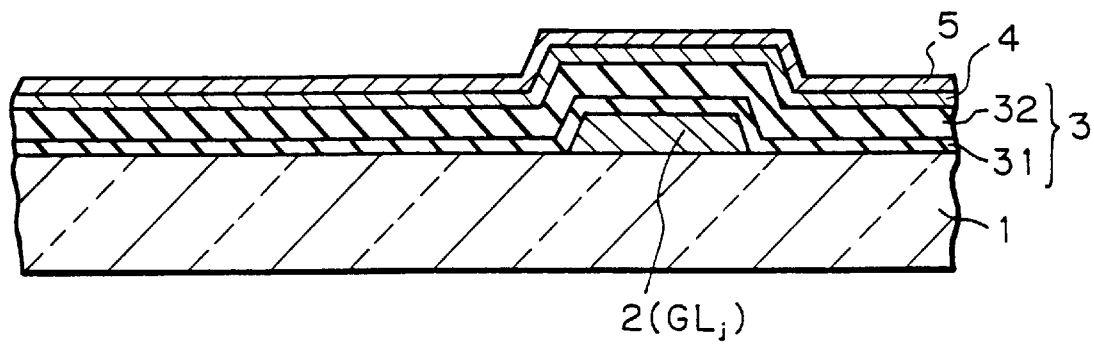

Next, referring to FIG. 7B, in the same way as in FIG. 2B, an I-type amorphous silicon layer 4 for channel regions of TFT's is deposited on the entire surface, and an N-type amorphous silicon layer 5 for low-resistance contact structures is deposited thereon.

Figure 7C:
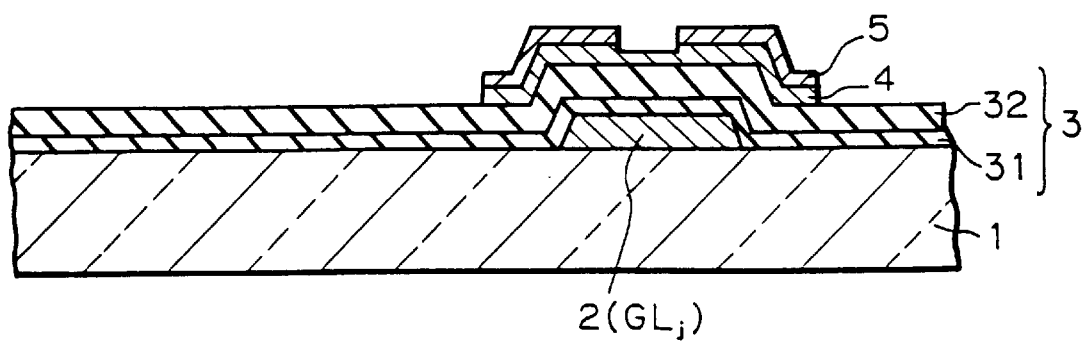

Next, referring to FIG. 7C, in the same way as in FIG. 2C, the amorphous silicon layers 4 and 5 are patterned.

Figure 7D:
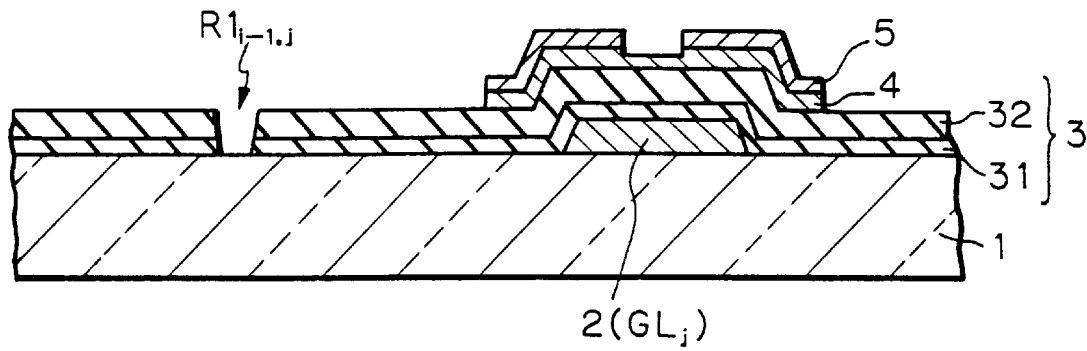

Next, referring to FIG. 7D, the gate insulating layer 3 is etched by using a dry etching process with a photoresist mask for forming contact structures (not shown), to form a recess portion such as $R1_{i-1,j}$ within the gate insulating layer 3. That is, the part of the gate insulating layer 3 between the signal line forming area A2 and the pixel electrode forming area A3 is etched.

Figure 7E:
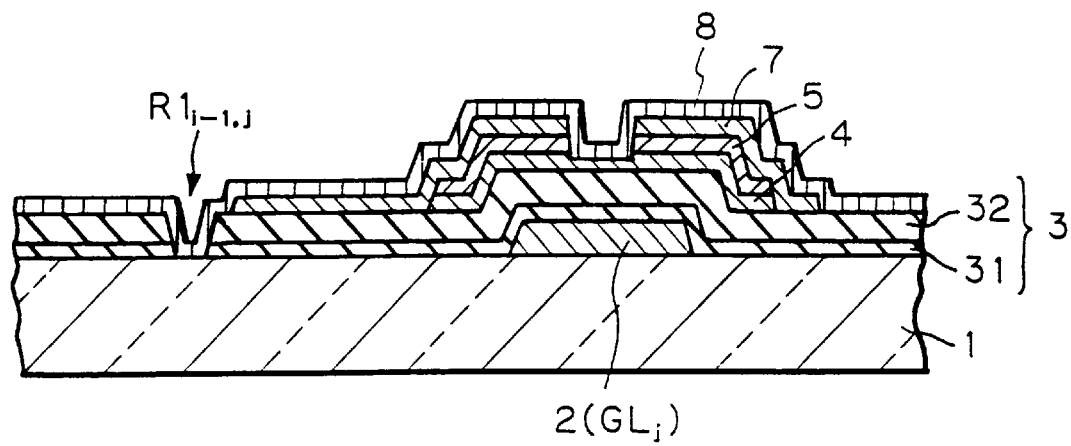

Next, referring to FIG. 7E, in the same way as in FIG. 2D, a conductive pattern layer 7 of a single layer or a multiple layer made of Cr, Mo/Ta, Al or Al/Ta is formed. Also, a transparent pixel electrode layer 8 made of ITO is formed on the entire surface.

Figure 7F:
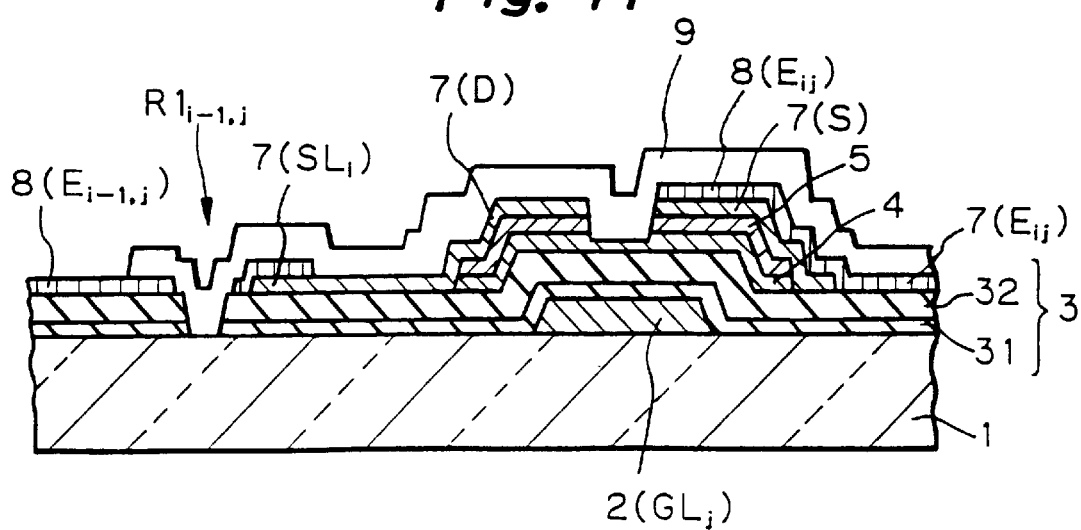

Finally, referring to FIG. 7F, in the same way as in FIG. 2E, the transparent pixel electrode layer 8 is patterned. Then, a passivation layer 9 is formed and is patterned. In this case, the periphery of the signal line $SL_i$ is shown in FIG. 8.

In FIG. 8, a recess portion $R1_{ij}$ in addition to the recess portion $R1_{i-1,j}$ is formed in the gate insulating layer 3. That is, the signal line $SL_i$ is surrounded by the recess portions $R1_{i-1,j}$ and $R1_{ij}$.

Thus, in the first embodiment, the part of the gate insulating layer 3 between the signal line forming area A2 and the pixel electrode forming area A3 is removed simultaneously with the formation of contact holes for the contact structures. Therefore, even when amorphous silicon is left on the gate insulating layer 3 between the signal line forming area A2 and the pixel electrode forming area A3 by an etching process of the amorphous silicon layers 4 and 5 as shown in FIG. 7C, such amorphous silicon is removed by an etching process of the gate insulating layer 3 as shown in FIG. 7D. Also, the etching process of the gate insulating layer 3 using a step of forming contact holes does not increase the manufacturing steps, so that the manufacturing cost is hardly increased.

A second embodiment of the present invention will be explained next with reference to FIGS. 9, 10A through 10F and 11.

Figure 9:
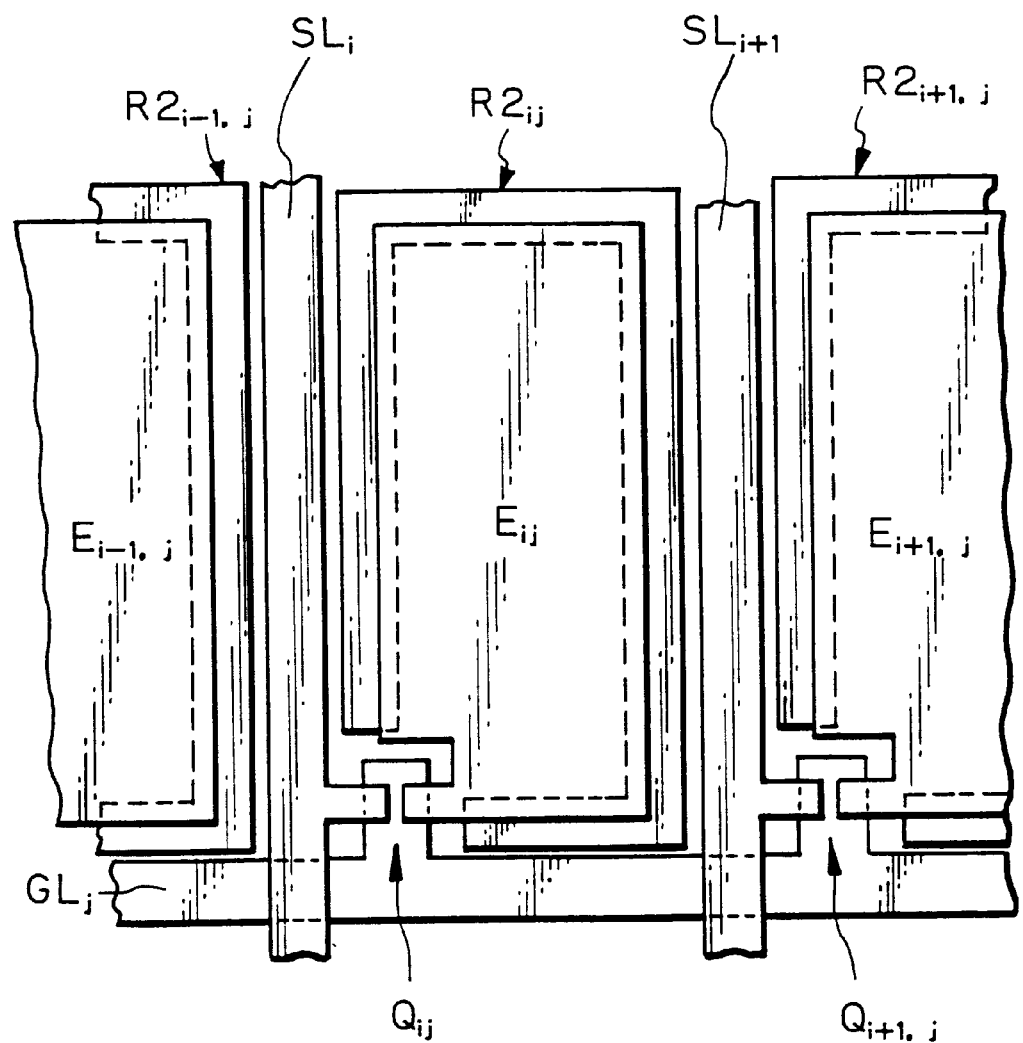
FIG. 9 is a plan view illustrating an active matrix LCD device according to the present invention.

FIG. 9 is a plan view that illustrates an active matrix LCD device according to the present invention; FIGS. 10A through 10F are cross-sectional views showing a method for manufacturing the device of FIG. 9; and FIG. 11 is a cross-sectional view of the signal line $SL_i$ of FIG. 9.

As shown in FIG. 9, a recess portion such as $R2_{i-1,j}$ is formed in the gate insulating layer 3 (not shown in FIG. 9, but shown in FIGS. 10D, 10E and 10F) between the signal line forming area A2 and the pixel electrode forming area A3. Also, the pixel electrode such as $E_{ij}$ extends over the recess portion $R2^{ij}$. As a result, even when the signal line $SL_i$ is brought very close to the pixel electrodes $E_{i-1,j}$ and $E_{ij}$, the part of amorphous silicon therebetween can be completely removed.

Figure 10A:
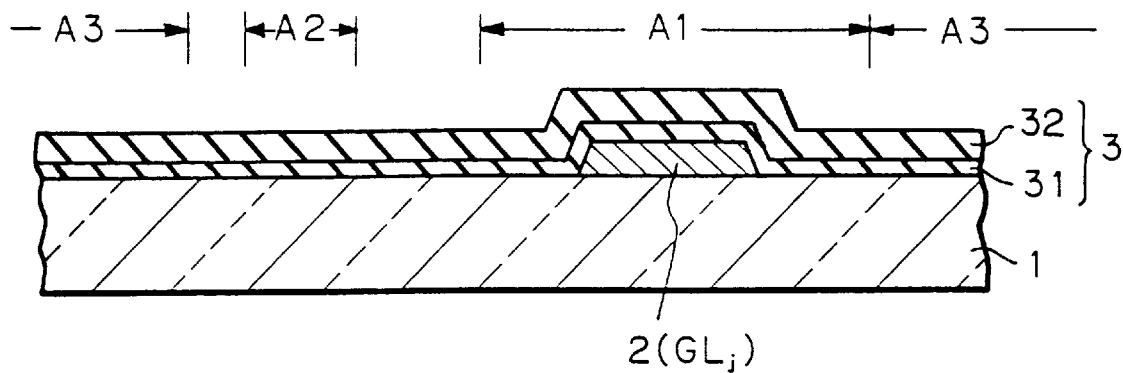
FIGS. 10A through 10F are cross-sectional views showing a second embodiment of the method for manufacturing the active matrix LCD device of FIG. 9.
Figure 11:
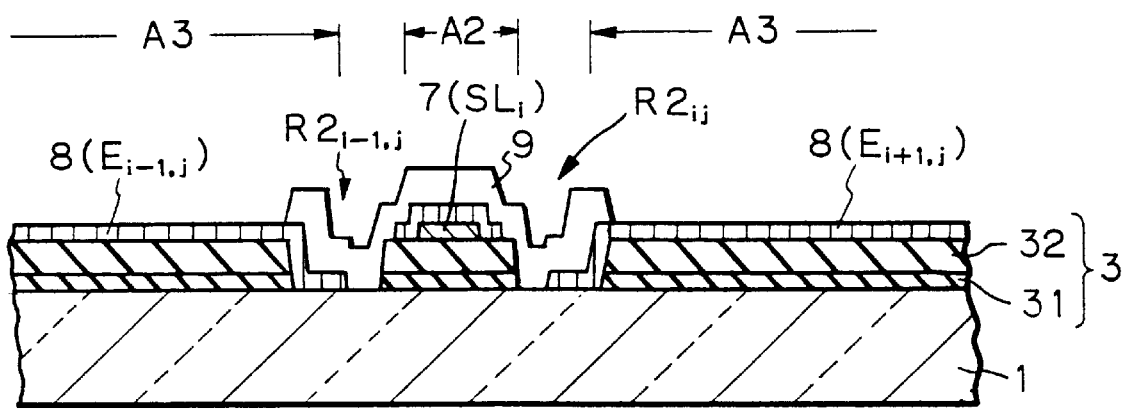
FIG. 11 is a cross-sectional view of the signal line of FIG. 9.

Referring to FIG. 10A, in the same way as in FIG. 7A, a gate line layer 2 is formed on the TFT forming area A1 of a glass substrate 1. Also, a first gate insulating layer 31 made of TaO, SiO or the like is deposited on the entire surface, and then, a second gate insulating layer 32 made of SiN or the like is deposited thereon, to form a gate insulating layer 3.

Figure 10B:
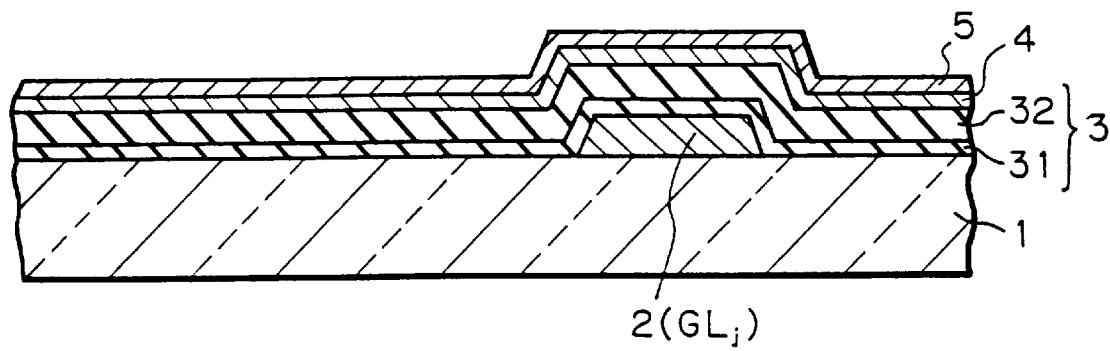

Next, referring to FIG. 10B, in the same way as in FIG. 7B, an I-type amorphous silicon layer 4 for channel regions of TFT's is deposited on the entire surface, and an N-type amorphous silicon layer 5 for low-resistance contact structures is deposited thereon.

Figure 10C:
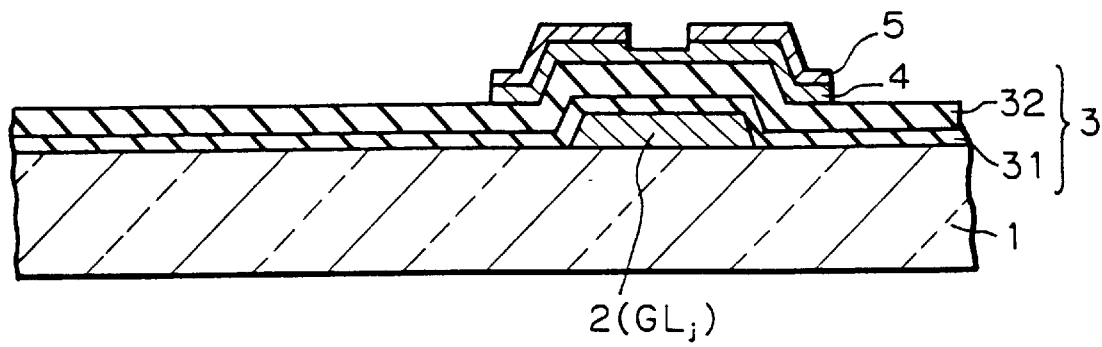

Next, referring to FIG. 10C, in the same way as in FIG. 7C, the amorphous silicon layers 4 and 5 are patterned.

Figure 10D:
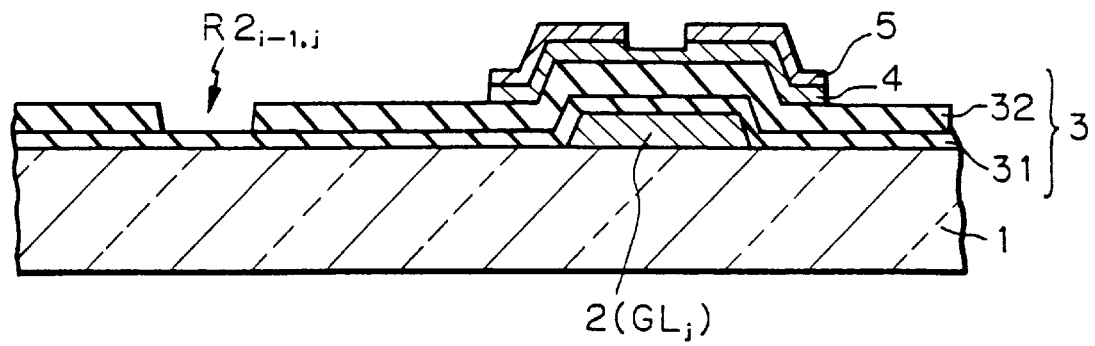

Next, referring to FIG. 10D, in the same way as in FIG. 7D, the gate insulating layer 3 is etched by using a dry etching process with a photoresist mask for forming contact structures (not shown), to form a recess portion such as $R2_{i-1,j}$ within the gate insulating layer 3. That is, the part of the gate insulating layer 3 between the signal line forming area A2 and the pixel electrode forming area A3 is etched.

Figure 10E:
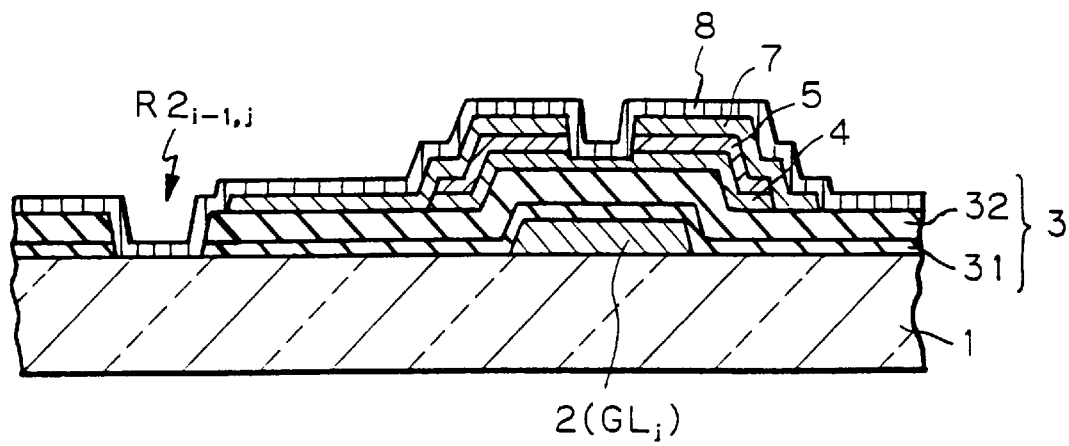

Next, referring to FIG. 10E, in the same way as in FIG. 7E, a conductive pattern layer 7 of a single layer or a multiple layer made of Cr, Mo/Ta, Al or Al/Ta is formed. Also, a transparent pixel electrode layer 8 made of ITO is formed on the entire surface.

Figure 10F:
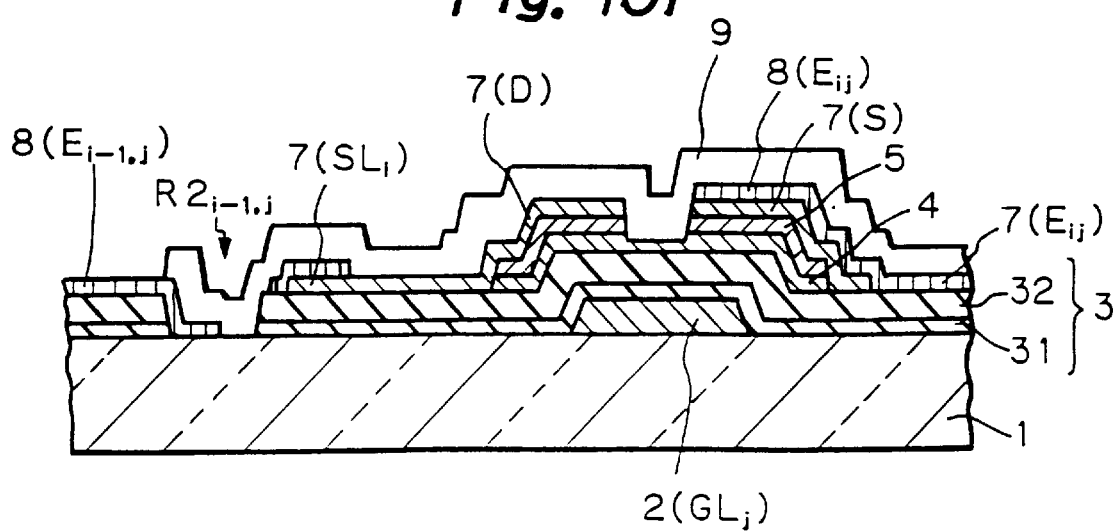

Finally, referring to FIG. 10F, in the same way as in FIG. 7F, the transparent pixel electrode layer 8 is patterned. In this case, the pixel electrode layer 8 ($E_{i-1,j}$) is locately partly over the recess portion $R2_{i-1,j}$ of the gate insulating layer 3. Then, a passivation layer 9 is formed and is patterned. In this case, the periphery of the signal line $SL_i$ is shown in FIG. 11.

In FIG. 11, a recess portion $R2_{ij}$ in addition to the recess portion $R2_{i-1,j}$ is formed in the gate insulating layer 3. That is, the signal line $SL_i$ is surrounded by the recess portions $R2_{i-1,j}$ and $R2_{ij}$ over which the pixel electrode layers 8 ($E_{i-1,j}$) and 8 ($E_{ij}$) extend.

Thus, even in the second embodiment, the part of the gate insulating layer 3 between the signal line forming area A2 and the pixel electrode forming area A3 is removed simultaneously with the formation of contact holes for the contact structures. Also, the pixel electrode layer 8 is located partly over the recess portions $R2_{i-1,j}$ and $R2_{ij}$. Therefore, even when a distance between the signal line forming area A2 and the pixel electrode forming area A3 is very small and amorphous silicon is left on the gate insulating layer 3 therebetween by an etching process of the amorphous silicon layers 4 and 5 as shown in FIG. 10C, such amorphous silicon is removed by an etching process of the gate insulating layer 3 as shown in FIG. 10D. Also, the etching process of the gate insulating layer 3 using a step of forming contact holes does not increase the manufacturing steps, so that the manufacturing cost is hardly increased.

A third embodiment of the present invention will be explained next with reference to FIGS. 12, 13A through 13F and 14.

Figure 12:
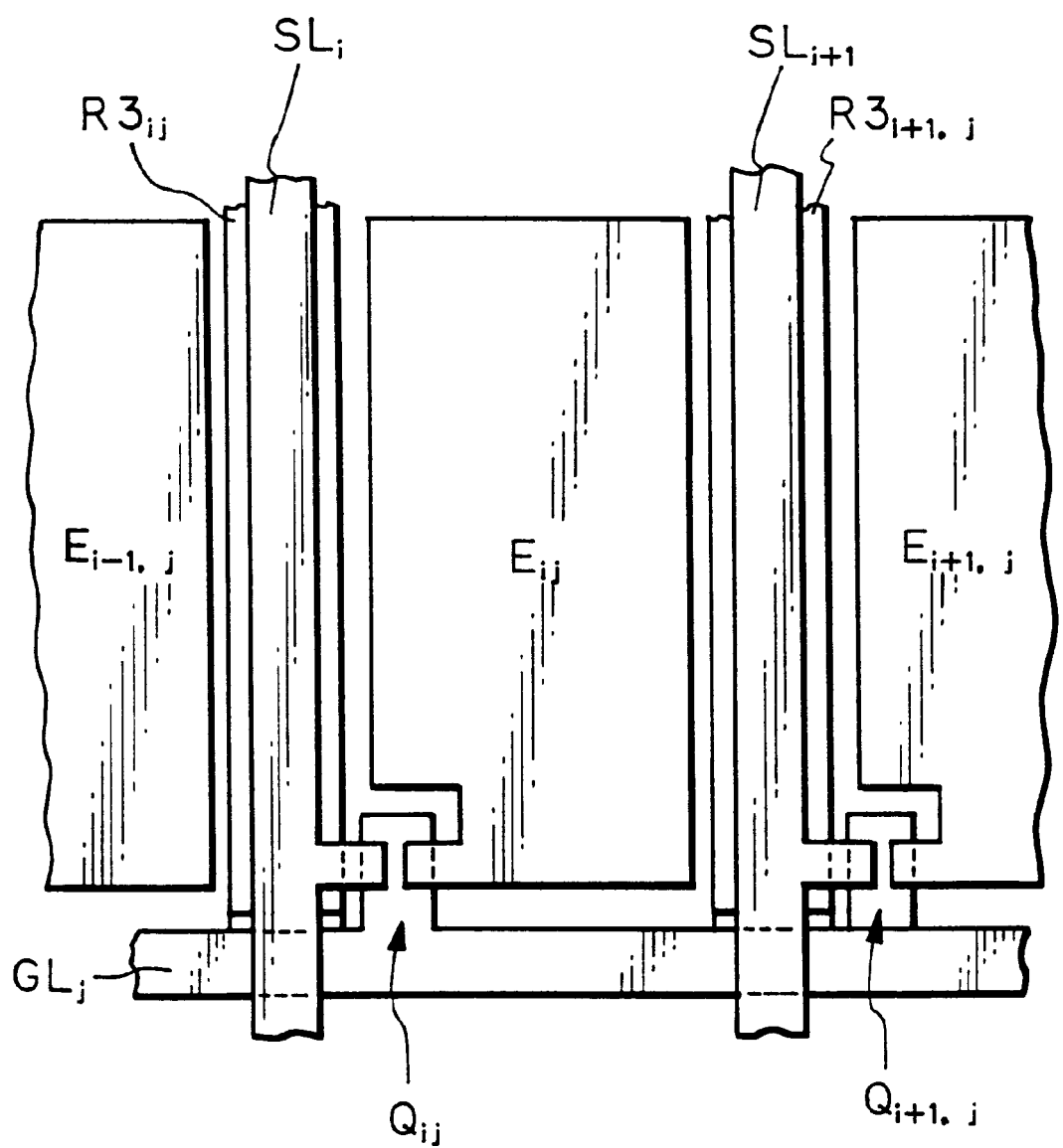
FIG. 12 is a plan view illustrating an active matrix LCD device according to the present invention.

FIG. 12 is a plan view that illustrates an active matrix LCD device according to the present invention; FIGS. 13A through 13F are cross-sectional views showing a method for manufacturing the device of FIG. 12; and FIG. 14 is a cross-sectional view of the signal line $SL_i$ of FIG. 12.

As shown in FIG. 12, a recess portion such as $R3_{i-1,j}$ is formed in the gate insulating layer 3 (not shown in FIG. 12, but shown in FIGS. 13D, 13E and 13F) beneath the signal line layers $SL_i$, $SL_{i+1}$ as well as between the signal line forming area and the pixel electrode forming area.

Figure 13A:
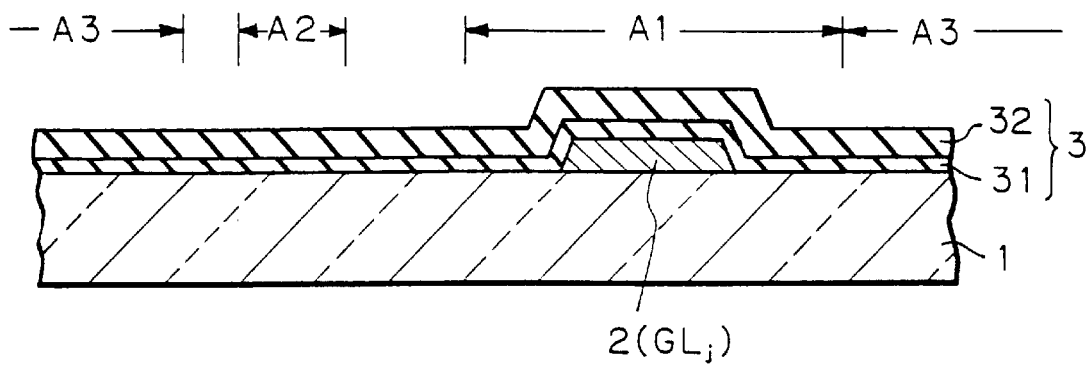
FIGS. 13A through 13F are cross-sectional views showing a third embodiment of the method for manufacturing the active matrix LCD device of FIG. 12.
Figure 14:
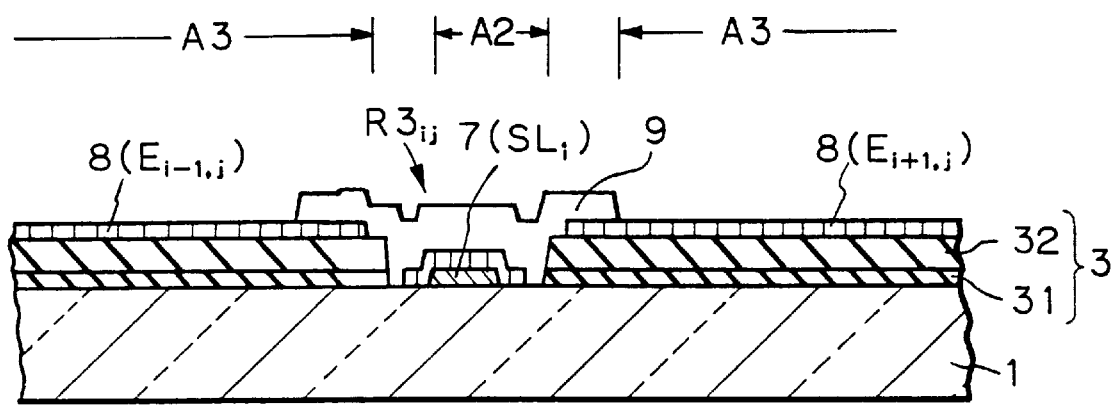
FIG. 14 is a cross-sectional view of the signal line of FIG. 12.

Referring to FIG. 13A, in the same way as in FIG. 7A, a gate line layer 2 is formed on the TFT forming area A1 of a glass substrate 1. Also, a first gate insulating layer 31 made of TaO, SiO or the like is deposited on the entire surface, and then, a second gate insulating layer 32 made of SiN or the like is deposited thereon, to form a gate insulating layer 3.

Figure 13B:
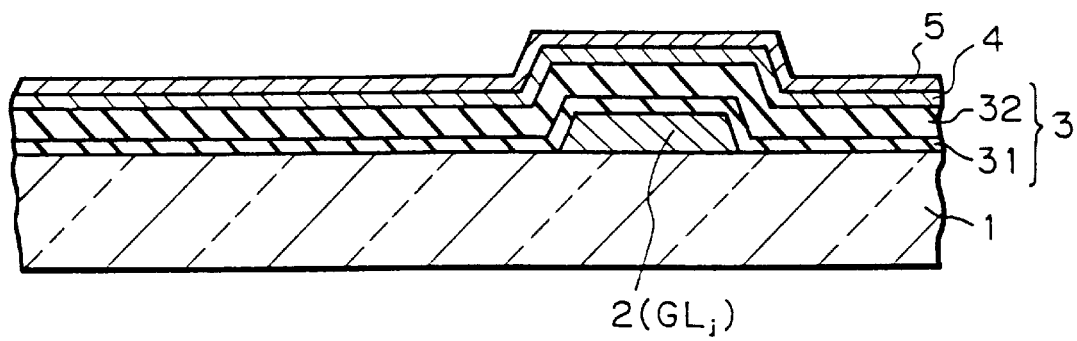

Next, referring to FIG. 13B, in the same way as in FIG. 7B, an I-type amorphous silicon layer 4 for channel regions of TFT's is deposited on the entire surface, and an N-type amorphous silicon layer 5 for low-resistance contact structures is deposited thereon.

Figure 13C:
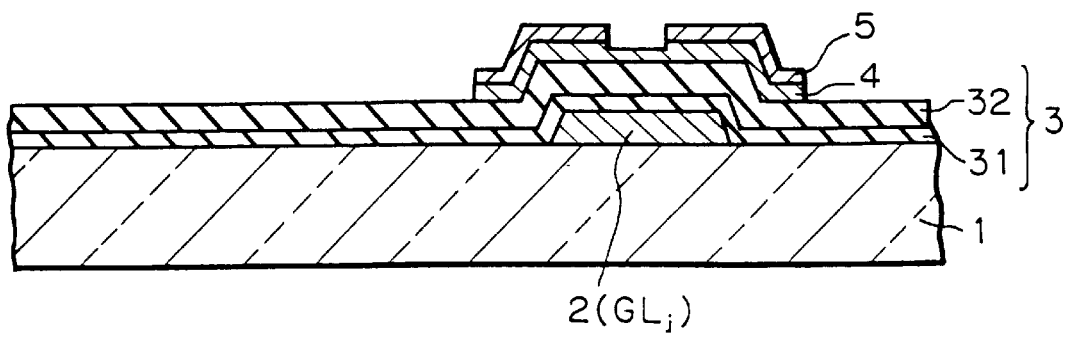

Next, referring to FIG. 13C, in the same way as in FIG. 7C, the amorphous silicon layers 4 and 5 are patterned.

Figure 13D:
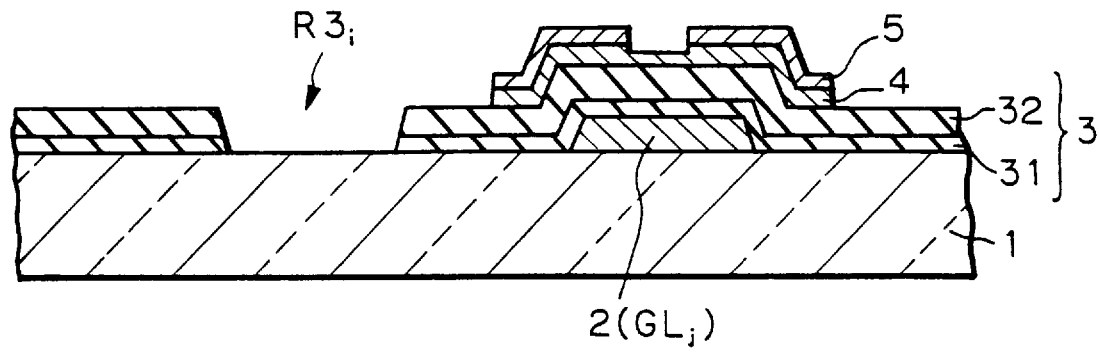

Next, referring to FIG. 13D, in the same way as in FIG. 7D, the gate insulating layer 3 is etched by using a dry etching process with a photoresist mask for forming contact structures (not shown), to form a recess portion such as $R3_{ij}$ within the gate insulating layer 3. That is, the part of the gate insulating layer 3 in the signal line forming area A2 and between the signal line forming area A2 and the pixel electrode forming area A3 is etched.

Figure 13E:
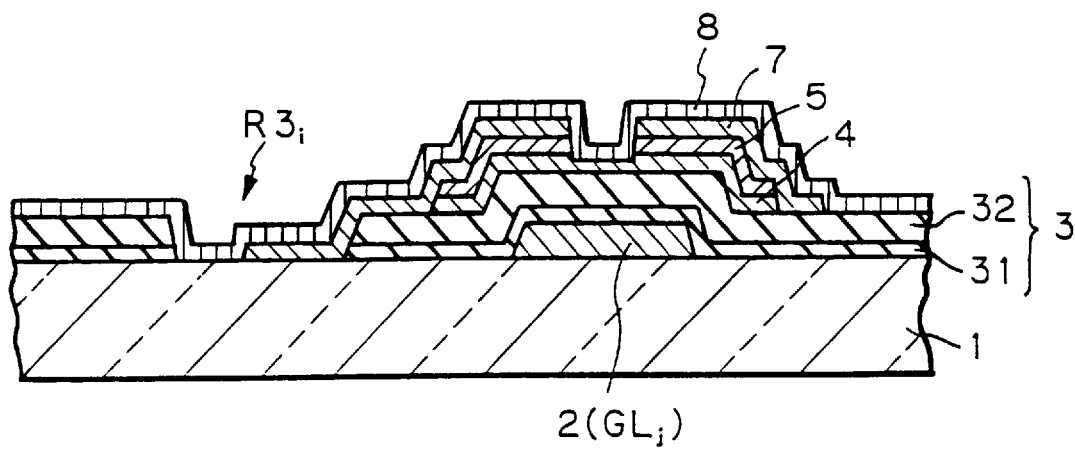

Next, referring to FIG. 13E, in the same way as in FIG. 7D, a conductive pattern layer 7 of a single layer or a multiple layer made of Cr, Mo/Ta, Al or Al/Ta is formed. Also, a transparent pixel electrode layer 8 made of ITO is formed on the entire surface.

Figure 13F:
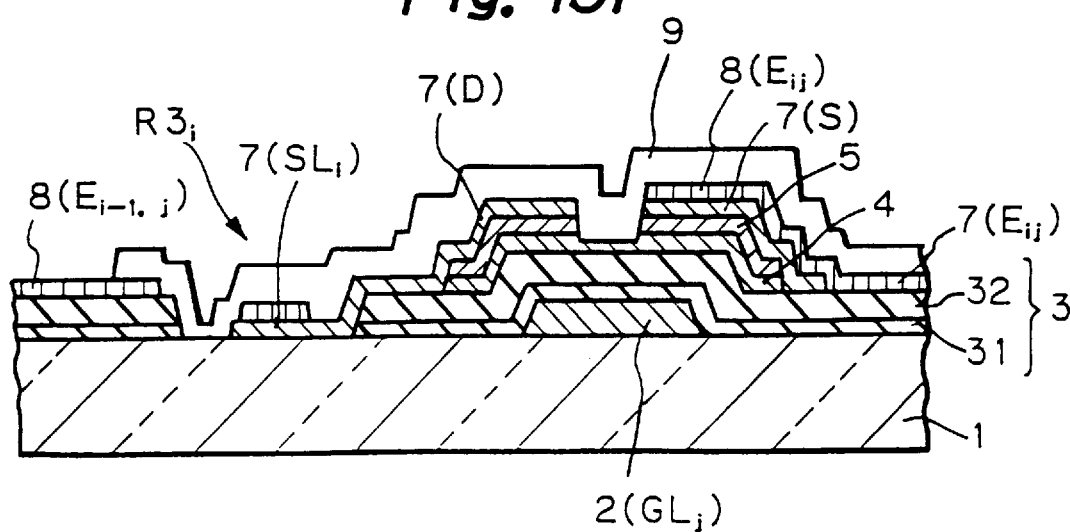

Finally, referring to FIG. 13F, the transparent pixel electrode layer 8 is patterned. Thus, the signal line $SL_i$ is formed within the recess portion R3$_{ij}$. Then, a passivation layer 9 is formed and is patterned. In this case, the periphery of the signal line SL$_i$ is shown in FIG. 14.

In FIG. 14, the recess portion R3$_{ij}$ is formed in the gate insulating layer 3. That is, the signal line SL$_i$ is located within the recess portion R3$_{ij}$.

Thus, even in the third embodiment, the part of the gate insulating layer 3 in the signal line forming area A2 and between the signal line forming area A2 and the pixel electrode forming area A3 is removed simultaneously with the formation of contact holes for the contact structures. Therefore, even when a distance between the signal line forming area A2 and the pixel electrode forming area A3 is very small and amorphous silicon is left on the gate insulating layer 3 therebetween by an etching process of the amorphous silicon layers 4 and 5 as shown in FIG. 13C, such amorphous silicon is removed by an etching process of the gate insulating layer 3 as shown in FIG. 13D. Also, the etching process of the gate insulating layer 3 using a step of forming contact holes does not increase the manufacturing steps, so that the manufacturing cost is hardly increased.

A fourth embodiment of the present invention will be explained next with reference to FIGS. 15A through 15F and 16. FIGS. 15A through 15F are cross-sectional views showing a method for manufacturing the device of FIG. 6 and FIG. 16 is a cross-sectional view of the signal line SL$_i$ of FIG. 6.

In the fourth embodiment, the recess portion such as R1$_{i-1,j}$ is formed in the passivation layer 9 and the gate insulating layer 3 (not shown in FIG. 12, but shown in FIG. 15F) between the signal line forming area A2 and the pixel electrode forming area A3.

Figure 15A:
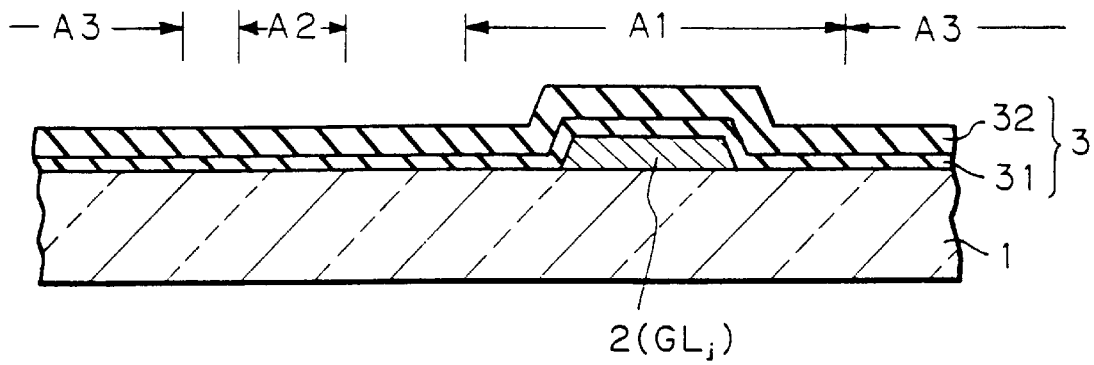
FIGS. 15A through 15F are cross-sectional views showing a fourth embodiment of the method for manufacturing the active matrix LCD device of FIG. 6.
Figure 16:
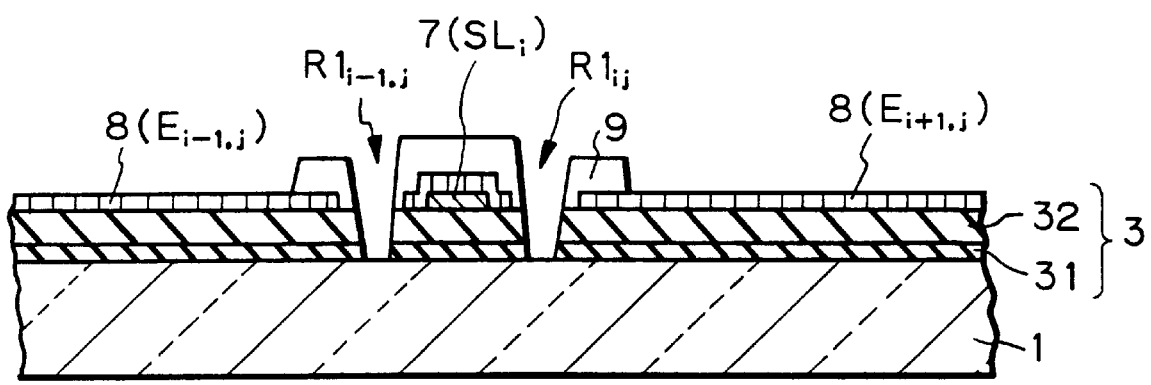
FIG. 16 is a cross-sectional view of the signal line of FIG. 6.

Referring to FIG. 15A, in the same way as in FIG. 7A, a gate line layer 2 is formed on the TFT forming area A1 of a glass substrate 1. Also, a first gate insulating layer 31 made of TaO, SiO or the like is deposited on the entire surface, and then, a second gate insulating layer 32 made of SiN or the like is deposited thereon, to form a gate insulating layer 3.

Figure 15B:
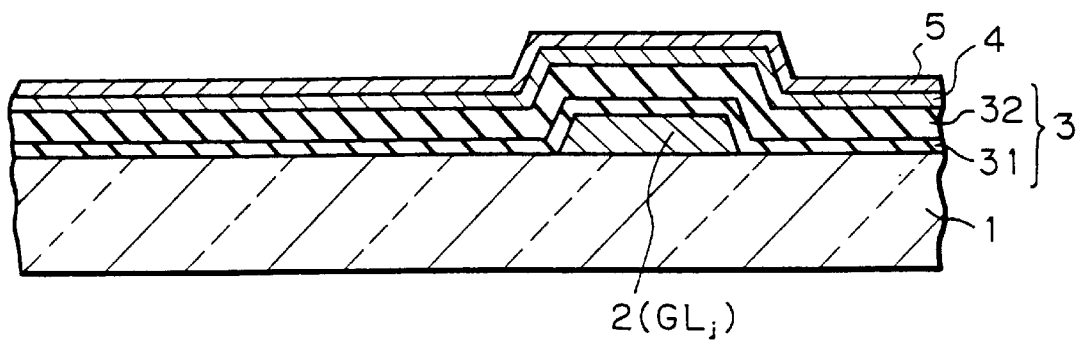

Next, referring to FIG. 15B, in the same way as in FIG. 7B, an I-type amorphous silicon layer 4 for channel regions of TFT's is deposited on the entire surface, and an N-type amorphous silicon layer 5 for low-resistance contact structures is deposited thereon.

Figure 15C:
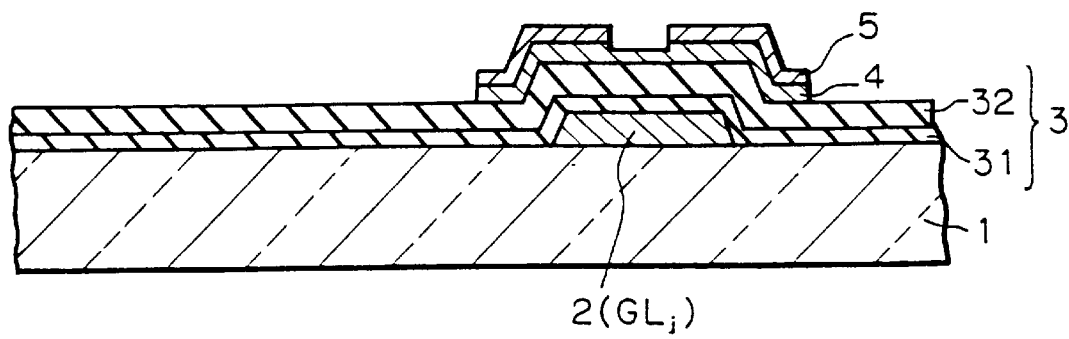

Next, referring to FIG. 15C, in the same way as in FIG. 7C, the amorphous silicon layers 4 and 5 are patterned.

Next, the gate insulating layer 3 is etched by using a dry etching process with a photoresist mask for forming contact structures (not shown). In this case, however, the part of the gate insulating layer 3 between the signal line forming area A2 and the pixel electrode forming area A3 is not etched.

Figure 15D:
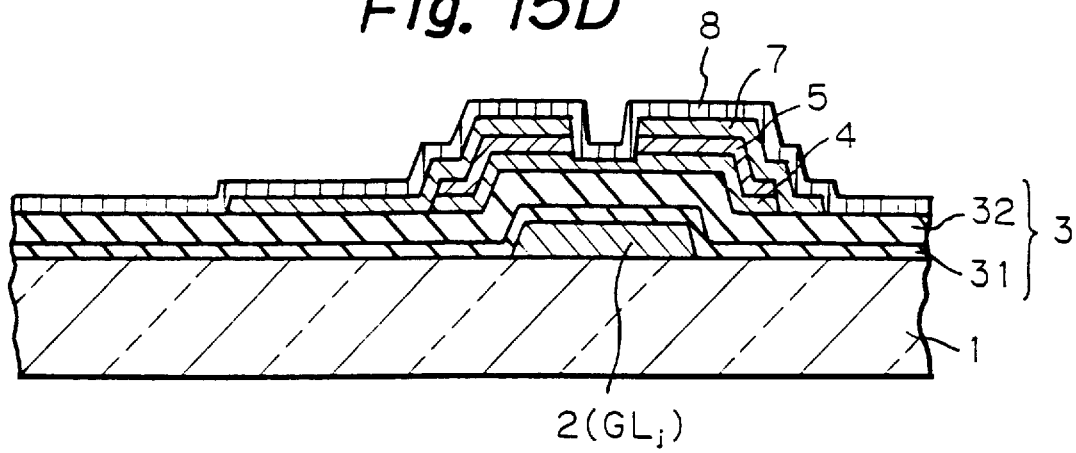

Next, referring to FIG. 15D, in the same way as in FIG. 7E, a conductive pattern layer 7 of a single layer or a multiple layer made of Cr, Mo/Ta, Al or Al/Ta is formed.

Figure 15E:
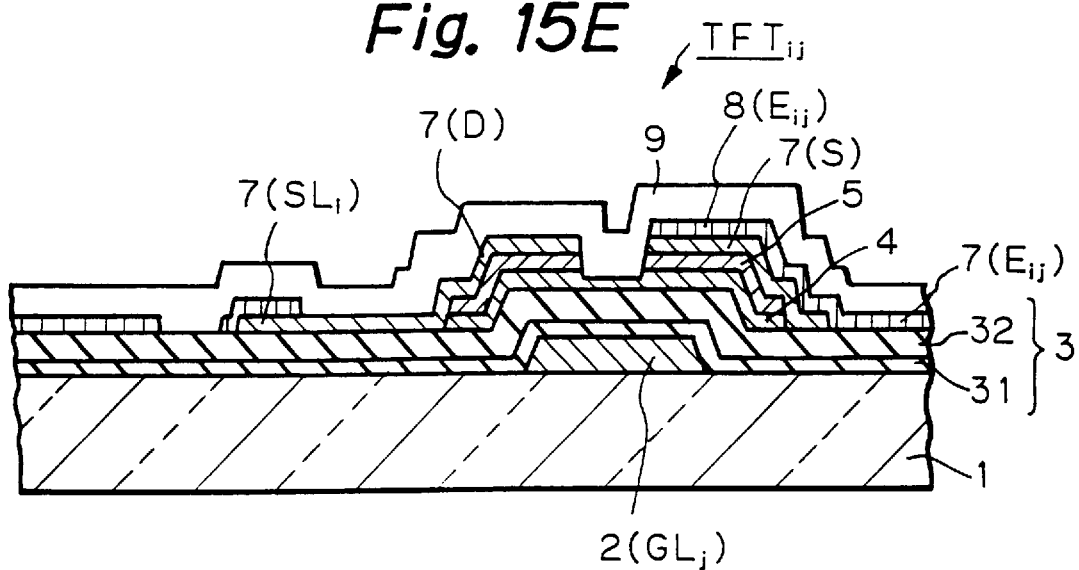

Next, referring to FIG. 15E, a transparent pixel electrode layer 8 made of ITO is formed on the entire surface.

Figure 15F:
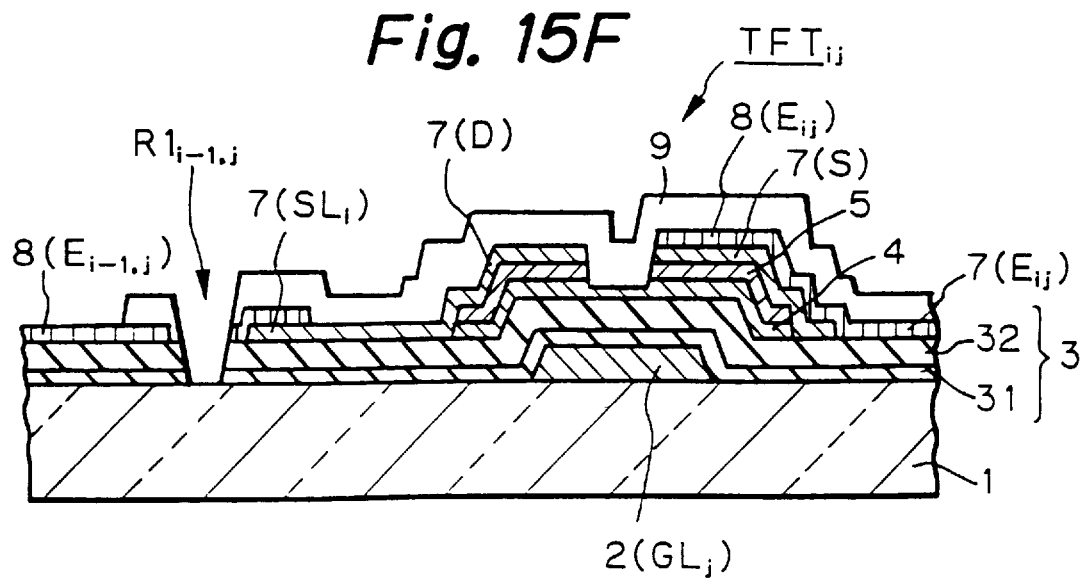

Finally, referring to FIG. 15F, a passivation layer 9 is formed. Then, the passivation layer 9 and the gate insulating layer 3 are simultaneously patterned. In this case, the periphery of the signal line SL$_i$ is shown in FIG. 16.

In FIG. 16, a recess portion R1$_{ij}$ in addition to the recess portion R1$_{i-1,j}$ is formed in the gate insulating layer 3. That is, the signal line SL$_i$ is surrounded by the recess portions R1$_{i-1,j}$ and R1$_{ij}$.

Thus, even in the fourth embodiment, the part of the gate insulating layer 3 between the signal line forming area A2 and the pixel electrode forming area A3 is removed simultaneously with the formation of contact holes for the contact structures. Therefore, even when amorphous silicon is left on the gate insulating layer 3 between the signal line forming area A2 and the pixel electrode forming area A3 by an etching process of the amorphous silicon layers 4 and 5 as shown in FIG. 15C, such amorphous silicon is removed by an etching process of the gate insulating layer 3 as shown in FIG. 15F. Also, the etching process of the gate insulating layer 3 using a step of forming contact holes does not increase the manufacturing steps, so that the manufacturing cost is hardly increased.

As explained hereinbefore, according to the present invention, even when an etching process performed upon amorphous silicon fails to etch a part of the amorphous silicon between a signal line forming area and a pixel electrode forming area, a short circuit between an signal line and a pixel electrode can be avoided.

We claim:

1. A method for manufacturing an LCD device, comprising the steps of:

forming a gate insulating layer on an insulating substrate;

forming a signal line pattern layer on a signal line area of said gate insulating layer;

forming a pixel electrode pattern layer on a pixel electrode area of said gate insulating layer;

forming a passivation layer on said signal line pattern and said pixel electrode pattern; and etching a part of said passivation layer and a part of said gate insulating layer between the signal line forming area and the pixel electrode forming area.

2. A method as set forth in claim 1, wherein said gate insulating layer etching step further etches said gate insulating layer in the signal line forming area.

3. A method for manufacturing an LCD device, comprising the steps of:

forming a gate line pattern layer on a TFT forming area of an insulating substrate;

forming a gate insulating layer on said insulating substrate and said gate line pattern layer;

forming an amorphous silicon pattern layer on the TFT forming area of said gate insulating layer;

forming a source/drain pattern layer and a signal line pattern layer on the TFT forming area and a signal line area, respectively, of said gate insulating layer;

forming a pixel electrode pattern layer on a pixel electrode area of said gate insulating layer;

forming a passivation layer on said signal line pattern and said pixel electrode pattern; and etching a part of said passivation layer and a part of said gate insulating layer between the signal line forming area and the pixel electrode forming area.

* * * * *